(12) United States Patent
Gluschenkov et al.

(10) Patent No.: US 12,144,270 B2
(45) Date of Patent: *Nov. 12, 2024

(54) BACK END OF LINE EMBEDDED RRAM STRUCTURE WITH GRAIN GROWTH ENHANCEMENT

(71) Applicant: INTERNATIONAL BUSINESS MACHINES CORPORATION, Armonk, NY (US)

(72) Inventors: Oleg Gluschenkov, Tannersville, NY (US); Alexander Reznicek, Troy, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 451 days.

This patent is subject to a terminal disclaimer.

(21) Appl. No.: 17/444,840

(22) Filed: Aug. 11, 2021

(65) Prior Publication Data

US 2023/0051017 A1 Feb. 16, 2023

(51) Int. Cl.
*H10N 70/00* (2023.01)
*H01L 23/522* (2006.01)

(52) U.S. Cl.
CPC ..... *H10N 70/8833* (2023.02); *H01L 23/5226* (2013.01); *H10N 70/043* (2023.02); *H10N 70/826* (2023.02)

(58) Field of Classification Search
CPC ..... H10N 70/8833; H10B 63/30; H10B 63/80
See application file for complete search history.

(56) References Cited

U.S. PATENT DOCUMENTS

| 8,048,755 | B2 | 11/2011 | Sandhu |
| 8,405,062 | B2 | 3/2013 | Yin |
| 8,791,444 | B2 | 7/2014 | Chin |
| 9,034,689 | B2 | 5/2015 | Sekar |
| 9,070,621 | B2 | 6/2015 | Sasago |

(Continued)

FOREIGN PATENT DOCUMENTS

WO 2018182649 A1 10/2018

OTHER PUBLICATIONS

IBM: List of IBM Patents or Patent Applications Treated as Related (Appendix P), Aug. 16, 2021, 2 pages.

(Continued)

*Primary Examiner* — Marvin Payen
(74) *Attorney, Agent, or Firm* — L. Jeffrey Kelly (57) ABSTRACT

A semiconductor structure may include a resistive random access memory device embedded between an upper metal interconnect and a lower metal interconnect in a backend structure of a chip. The resistive random access memory may include a bottom electrode and a top electrode separated by a dielectric film. A portion of the dielectric film directly above the bottom electrode may be doped and crystalline. The semiconductor structure may include a stud below and in electrical contact with the bottom electrode and the lower metal interconnect and a dielectric layer between the upper metal interconnect and the lower metal interconnect. The dielectric layer may separate the upper metal interconnect from the lower metal interconnect. The crystalline portion of the dielectric film may include grain boundaries that extend through an entire thickness of the dielectric film. The crystalline portion of the dielectric film may include grains.

20 Claims, 9 Drawing Sheets

(56) References Cited

U.S. PATENT DOCUMENTS

| | | |
|---|---|---|
| 9,246,085 B1 | 1/2016 | Wang |
| 10,096,773 B1 | 10/2018 | Ando |
| 10,333,064 B2 | 6/2019 | Sills |
| 10,541,151 B1 | 1/2020 | Lee |
| 10,833,150 B2 | 11/2020 | Frank |
| 10,910,435 B2 | 2/2021 | Reznicek |
| 2020/0194442 A1 | 6/2020 | Grenouillet |

OTHER PUBLICATIONS

Pending U.S. Appl. No. 17/444,841, filed Aug. 11, 20121, entitled: "Back End of Line Embedded RRAM Structure With Low Forming Voltage", 33 pages.

Barlas et al., "Improvement of HfO2 based RRAM array performances by local Si implantation", 2017 IEEE International Electron Devices Meeting (IEDM), pp. 14.6.1-14.6.4.

Waser, "Redox-based Tera-bit memories", EMRL, Electronic Materials Research Laboratory, Accessed on Apr. 16, 2021, 12 pages.

Xie et al., "Resistive Switching Properties of HfO2-based ReRAM with Implanted Si/Al Ions" AIP Conference Proceedings 1496, 26 (2012), pp. 26-29.

BACK END OF LINE EMBEDDED RRAM STRUCTURE WITH GRAIN GROWTH ENHANCEMENT

BACKGROUND

The present invention relates generally to a semiconductor structure and a method of forming the same. More particularly, the present invention relates to a back end of line (BEOL) embedded resistive random access memory (RRAM) structure with grain growth enhancement.

RRAM is a non-volatile computer memory technology. It is considered a promising technology for electronic synapse devices. RRAM may also be used as a memristor for neuromorphic computing and high-density and high-speed non-volatile memory applications. In neuromorphic computing applications, a RRAM structure may be used as a connection, or a synapse, between a pre-neuron and a post-neuron, representing the connection weight in the form of device resistance. Multiple pre-neurons and post-neurons may be connected through a crossbar array of RRAMs, which may naturally be expressed as a fully-connected neural network.

SUMMARY

According to one embodiment of the present invention, a semiconductor structure is provided. The semiconductor structure may include a resistive random access memory device embedded between an upper metal interconnect and a lower metal interconnect in a backend structure of a chip. The resistive random access memory may include a bottom electrode and a top electrode separated by a dielectric film. A portion of the dielectric film directly above the bottom electrode may be doped and crystalline. The semiconductor structure may include a stud below and in electrical contact with the bottom electrode and the lower metal interconnect and a dielectric layer between the upper metal interconnect and the lower metal interconnect. The dielectric layer may separate the upper metal interconnect from the lower metal interconnect. The crystalline portion of the dielectric film may include grain boundaries that extend through an entire thickness of the dielectric film. The crystalline portion of the dielectric film may include grains. An average grain size may be larger than a thickness of the dielectric film. The grains may have non-ferroelectric properties. The dielectric film may be made of hafnium oxide. The dopant may be silicon or zirconium. The stud may bridge a distance from the bottom electrode of the resistive random access memory to the lower metal interconnect.

According to another embodiment of the present invention, a semiconductor structure is provided. The semiconductor structure may include a resistive random access memory device embedded between an upper metal interconnect and a lower metal interconnect in a backend structure of a chip. The resistive random access memory may include a bottom electrode and a top electrode separated by a dielectric film. The top electrode may be below and in electrical contact with the upper metal interconnect. A portion of the dielectric film directly above the bottom electrode may be doped and crystalline. The semiconductor structure may include a stud below and in electrical contact with the bottom electrode and the lower metal interconnect and a dielectric layer between the upper metal interconnect and the lower metal interconnect. The dielectric layer may separate the upper metal interconnect from the lower metal interconnect. The stud may be made of a refractory metal. The crystalline portion of the dielectric film may include grain boundaries that extend through an entire thickness of the dielectric film. The crystalline portion of the dielectric film may include grains. An average grain size may be larger than a thickness of the dielectric film. The grains may have non-ferroelectric properties. The dopant may be silicon or zirconium. The dielectric film may be made of hafnium oxide.

According to another embodiment of the present invention, a method is provided. The method may include forming a stud below and in electrical contact with a bottom electrode and a lower metal interconnect, depositing a dielectric layer between an upper metal interconnect and the lower metal interconnect, forming a resistive random access memory device embedded between the upper metal interconnect and the lower metal interconnect in a backend structure of a chip, locally doping with a dopant a portion of the dielectric film above the bottom electrode, and annealing the dielectric film to crystalize the doped portion of the dielectric film above the bottom electrode. The dielectric layer may separate the upper metal interconnect from the lower metal interconnect. The resistive random access memory may include a bottom electrode and a top electrode separated by a dielectric film. The crystalline portion of the dielectric film may include grain boundaries that extend through an entire thickness of the dielectric film. The crystalline portion of the dielectric film may include grains. An average grain size may be larger than a thickness of the dielectric film. The grains may have non-ferroelectric properties. The dopant may be silicon or zirconium. Annealing may include laser annealing. Locally doping may include ion implantation of doping atoms.

BRIEF DESCRIPTION OF THE DRAWINGS

The following detailed description, given by way of example and not intend to limit the invention solely thereto, will best be appreciated in conjunction with the accompanying drawings, in which.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Generally, the RRAM device, or structure, and other interconnects (i.e. metal wires) are fabricated during the BEOL process whereas transistors that may control the RRAM device are fabricated during the front end of line (FEOL) process. Temperature sensitive elements of state-of-the-art complementary metal oxide semiconductor (CMOS) logic circuits typically include the gate and active dopant structure of transistors and the interconnect network. Acceptable thermal budget for the gate stack and active dopant structures is limited to annealing exposures at about 450° C. for minutes, at about 500° C. for seconds, and at about 950° C. for hundreds of microseconds. Exceeding these thermal budgets thickens the gate dielectric, shifts transistor threshold voltages, and deactivates dopants. Acceptable thermal budget for a network of copper (Cu) metal interconnects is limited to annealing exposures at about 400° C. for hours and at temperatures near but below the melting point of Cu (1085° C.) for several microseconds. Exceeding these thermal budgets causes a drop in the overall interconnect reliability, degrading both the electromigration-driven reliability for Cu metal interconnects or vias. Other elements may have different thermal budget constraints, but their stability and integrity is typically maintained if the gate stack and interconnect thermal budget limitations are satisfied. Accordingly, the maximum thermal budget of BEOL processing should not exceed 400° C. for conventional long duration anneals and 1000° C. for ultra-short-scale anneals. It is highly desirable to form large-grain crystallized dielectric layers for neuromorphic devices embedded into BEOL interconnect structure.

A typical RRAM device may include a dielectric film positioned between two electrodes such as, for example, a top electrode and a bottom electrode. Properties of the dielectric film may change when different voltages are applied to the two electrodes. When a voltage is applied to an electrode, a conductive path, in a form of a filament, is created in the dielectric film. This is called an electroforming step. It is undesirable to have high forming voltage since it will require multiple transistors to apply such high forming voltage. The filament may form randomly within the dielectric film. Further, more filaments form when higher voltages are applied to the electrodes. The filament may be used to store information. As a result, a particular conductance of the dielectric film may be programmed by controlling the number of filaments formed within the dielectric film. This may be accomplished by applying different voltages to the electrodes. At lower voltages, such as less than 2V, the number of filaments randomly formed within the dielectric film may be controlled. However, this control deteriorates when higher voltages, such as voltages higher than 2V, are applied to the electrode because the filaments randomly form everywhere within the dielectric film. This creates higher RRAM device variability as the RRAM device is scaled. As a result, forming the filaments at lower voltages is preferred because at lower voltages the speed at which the filaments are formed may be controlled and the filaments are formed consistently and in increments.

The dielectric film, in which the filaments are formed, may be made of a metal oxide. The metal oxide may be fully amorphous, poly-crystalline, or amorphous with small crystalline structures, or grains. During the formation of the filaments, voltage is applied to the electrode and the defects, typically vacancies, are formed within the dielectric film. These defects can organize themselves into one-dimensional, filament-like structures providing an easy path for charged particles (e.g. electrons) to traverse through the dielectric film. The rate at which such defects are formed and organized into filaments at a given applied voltage or, more accurately, applied electrical field depends on the type of dielectric and dielectric material crystallinity. Fully amorphous and single-crystalline dielectric materials may have a low defect generation rate at low electric fields due to material homogeneity. At a certain high electric field, the defects start to form everywhere within a homogeneous dielectric film causing numerous filaments to appear randomly and simultaneously. While this mode of filament creation and programming may be suitable for an "ON-OFF" device (e.g. a digital memory), a neuromorphic device requires creating filaments in increments and at low electric fields. In poly-crystalline films, two regions form, a grain region and a grain boundary region. The grain region is pure crystalline, and the grain boundary region is a place where two grains meet. The grain boundary serves as a source of defects at low electric fields. In other words, the grain boundary has a high rate of generating defects at a low applied electric field. When voltage is applied, the filaments may primarily form within or in the vicinity of the grain boundary. The grain boundary extending from top to bottom electrodes is preferred because it eases formation of a conductive filament connecting between the electrodes. Accordingly, large-grain poly-crystalline dielectric films are preferred over those with small grains and amorphous films with small crystalline inclusions. Generally, crystallization of the dielectric film made of robust metal oxide occurs at temperature of about 400° C. However, as stated above, exposing the BEOL interconnects to such a high temperature, for normal duration such as, minutes, may cause the BEOL interconnects to lose their integrity. Therefore, there exists a need to form a BEOL embedded RRAM structure with low forming voltages to accommodate the formation of current conducting filaments.

The present disclosure presents a method and structures to address the above described problems. More particularly, embodiments of the present invention relate to locally doping the dielectric film directly above a stud with a dopant such as, for example, silicon (Si), germanium (Ge), aluminum (Al), hafnium (Hf), titanium (Ti), tantalum (Ta), or zirconium (Zr), and then performing an anneal to promote or enhance local crystallization (above the stud) of the dielectric film for better embedded RRAM filament formation. The RRAM structure includes a dielectric film made of a metal oxide, locally doped with a dopant, that is crystalized by the user. In some instances, the doped dielectric film is crystalized by short duration laser anneal pulses. Locally doping the dielectric film above the stud reduces crystallization threshold temperature and promotes grain growth within the dielectric film. In some instances, the local doping also allows for forming grains with non-ferroelectric property. The grain growth is enhanced or promoted by the use of the laser anneal process.

FIGS. 1-9 illustrate a method of forming the BEOL embedded RRAM structure. During the formation of the RRAM structure, the dielectric film is first locally doped with a dopant. After which, an anneal is used to modify the dielectric film by forming grains above the stud to enable better programming of the RRAM structure at lower voltage.

Figure 1:
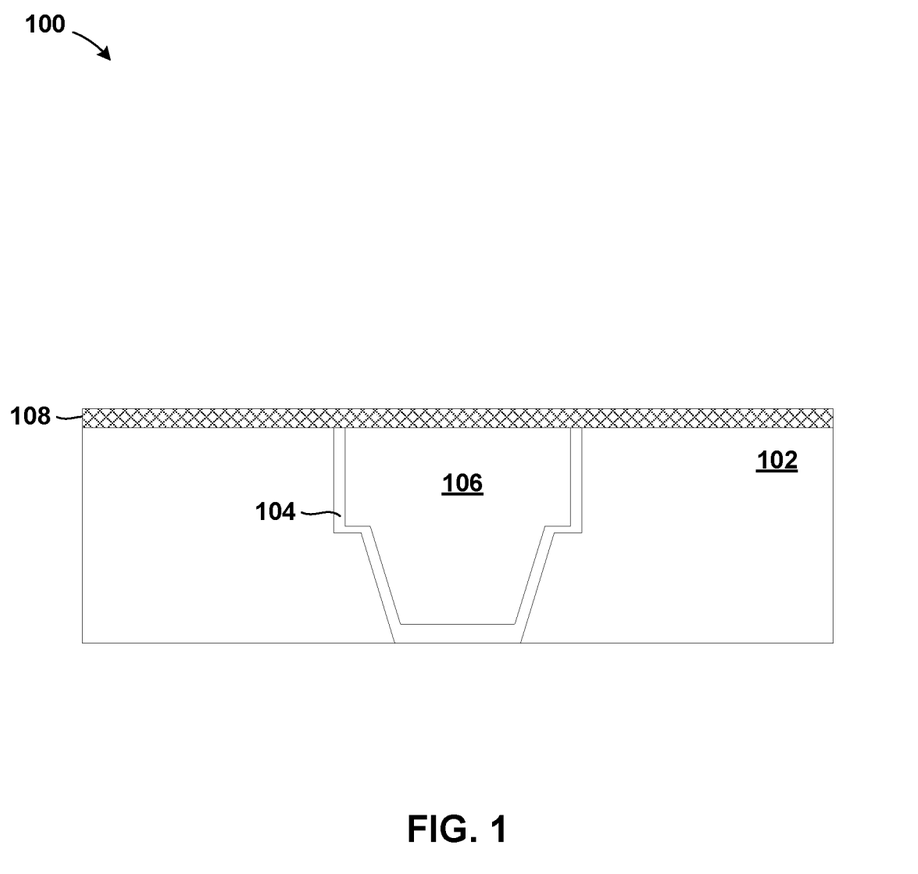
FIG. 1 is a cross section view illustrating a structure with a metal interconnect at a BEOL wire level according to an exemplary embodiment.

Referring now to FIG. 1, a structure 100 at a third wire level is shown, in accordance with an embodiment. The structure 100 may include a first dielectric layer 102, a liner 104 surrounding a metal interconnect 106, and a first dielectric cap layer 108. The first dielectric layer 102 may be made of a dielectric material such as, for example, silicon oxide. The first dielectric layer 102 may be patterned to form an interconnect trench (not shown). The liner 104 is then deposited, using known deposition techniques such as, for example, physical vapor deposition (PVD), chemical vapor deposition (CVD), or atomic layer deposition (ALD), on top of the structure 100. The liner 104 separates the metal interconnect 106 from the first dielectric layer 102. The liner 104 may be made of but not limited to the combination of tantalum nitride and tantalum. The liner 104 may also be referred to as the first liner.

Once the trench is lined with the liner 104, the trench is filled with a metal such as, for example copper, to form the metal interconnect 106. The metal interconnect 106 may also be referred to as a lower metal interconnect which consists of but is not limited to copper. The first dielectric cap layer 108 is then deposited, using known deposition techniques, on top of structure 100, covering a top surface of the first dielectric layer 102 and a top surface of the metal interconnect 106. The first dielectric cap layer 108 may be made of nitrogen doped silicon carbide or carbon doped silicon nitride.

As stated above, the structure 100 includes the metal interconnect 106 at the BEOL wire level. Before the BEOL wire level is formed, the structure 100 may undergo an FEOL process where transistors and other FEOL devices and isolation structures may be formed on a substrate. The structure 100 may then undergo BEOL processing during which lower and denser metal interconnect levels are formed. Further, it should be appreciated that that even though one metal interconnect 106 is illustrated, the structure 100 may include a plurality of metal interconnects 106 and the interconnects 106 can be at any wire level.

Figure 2:
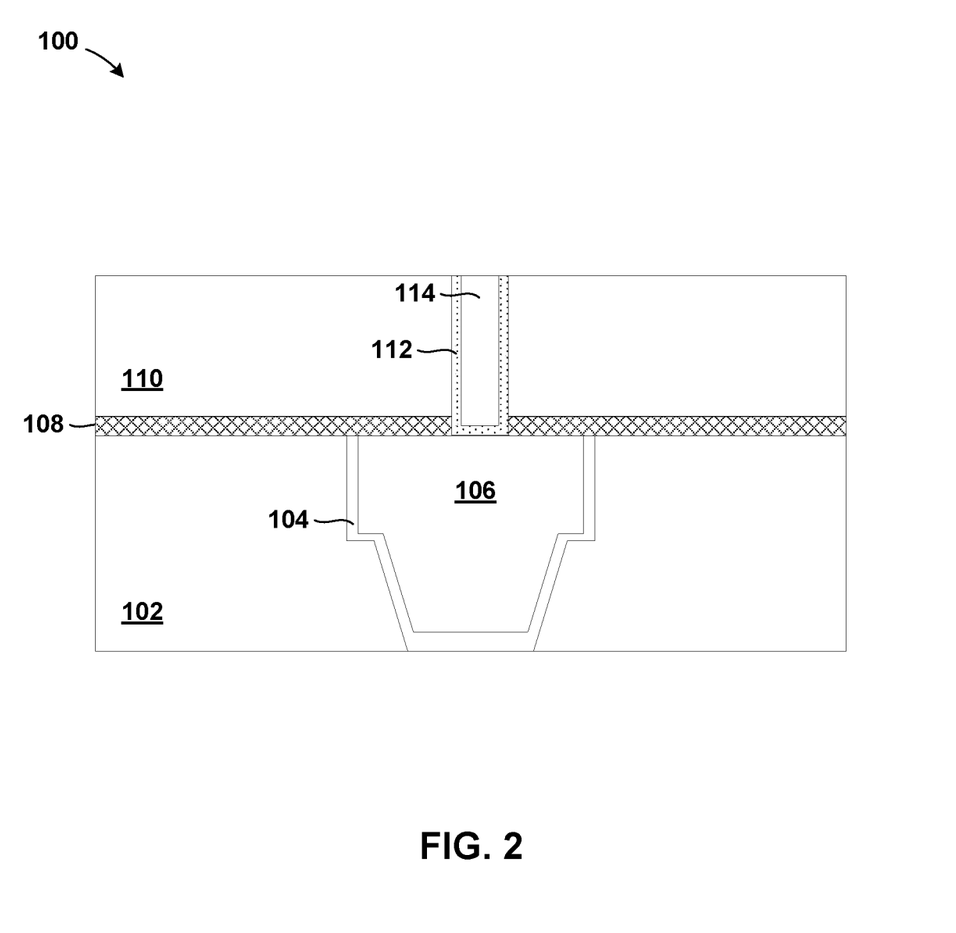
FIG. 2 is a cross section view illustrating a stud formed within a second dielectric layer according to an exemplary embodiment.

Referring now to FIG. 2, the structure 100 with a stud 114 is shown, in accordance with an embodiment. A second dielectric layer 110 is first deposited, using known deposition techniques, on top of the first dielectric cap layer 108. The second dielectric layer 110 may be made of a dielectric material such as silicon oxide, formed by tetraethylorthosilicate (TEOS). In an embodiment, the second dielectric layer 110 may be deposited to at thickness of about 400 nm. In other embodiments, the second dielectric layer 110 may be deposited to at thickness ranging from less than 100 nm to about 300 nm. The second dielectric layer 110 is then patterned to form an opening (not shown). A second liner 112 is then conformally deposited, using ALD, on top of the structure 100. The second liner 112 may be made of substantially the same material as the first liner 104. For example, the second liner 112 may be made of tantalum nitride, followed by titanium or titanium nitride. The stud trench is then filled with a refractory metal such as, for example, tungsten, to form the stud 114.

The stud 114 extends from a top surface of the second dielectric layer 110 to a top surface of the metal interconnect 106. The stud 114 provides electrical connectivity between the metal interconnect 106 and a bottom electrode that is formed in subsequent steps of manufacture. After the stud 114 is formed, the structure 100 undergoes a planarization process such as, for example, chemical mechanical polishing (CMP) to remove excess material from a top surface of the structure 100.

Figure 3:
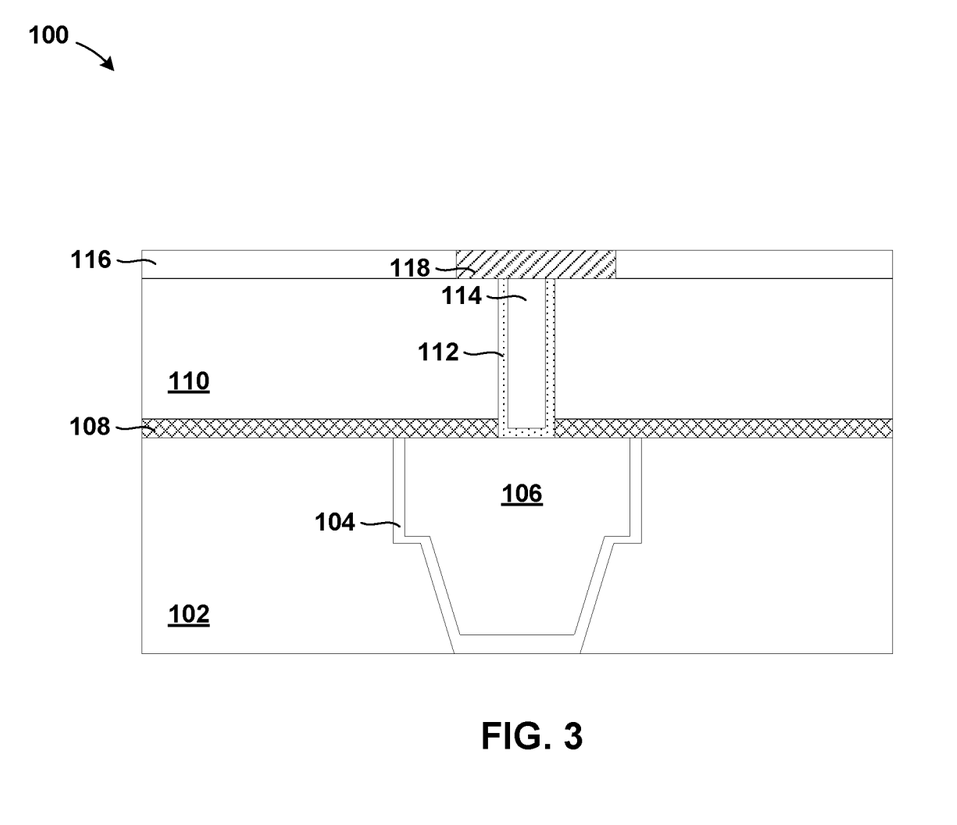
FIG. 3 is a cross section view illustrating a bottom electrode formed above the stud according to an exemplary embodiment.

Referring now to FIG. 3, the structure 100 with a bottom electrode 118 is shown, in accordance with an embodiment. A second dielectric cap layer 116 is first deposited on the top surface of the structure 100, covering the top surface of the stud 114 and the top surface of the second dielectric layer 110. The second dielectric cap layer 116 is deposited using known deposition techniques and may be made of substantially the same material as the first dielectric cap layer 108. For example, the second dielectric cap layer 116 may be made of a dielectric material such as silicon nitride.

In order to form the bottom electrode 118 within the second dielectric cap layer 116 the second dielectric cap layer 116 is patterned to form an opening (not shown). The opening is formed above the stud 114 and extends laterally beyond the outer sidewalls of the stud 114. The opening is then filled with a material such as, for example, tantalum nitride or titanium nitride to form the bottom electrode 118. The bottom electrode 118 may also be referred to as a first electrode. The bottom electrode 118 is in electrical contact with the metal interconnect 106 through the stud 114. That is, the stud bridges a distance from the bottom electrode 118 of the resistive random access memory to the metal interconnect 106. The structure 100 undergoes a planarization process such as, for example, CMP to remove excess material from a top surface of the structure 100.

Figure 4:
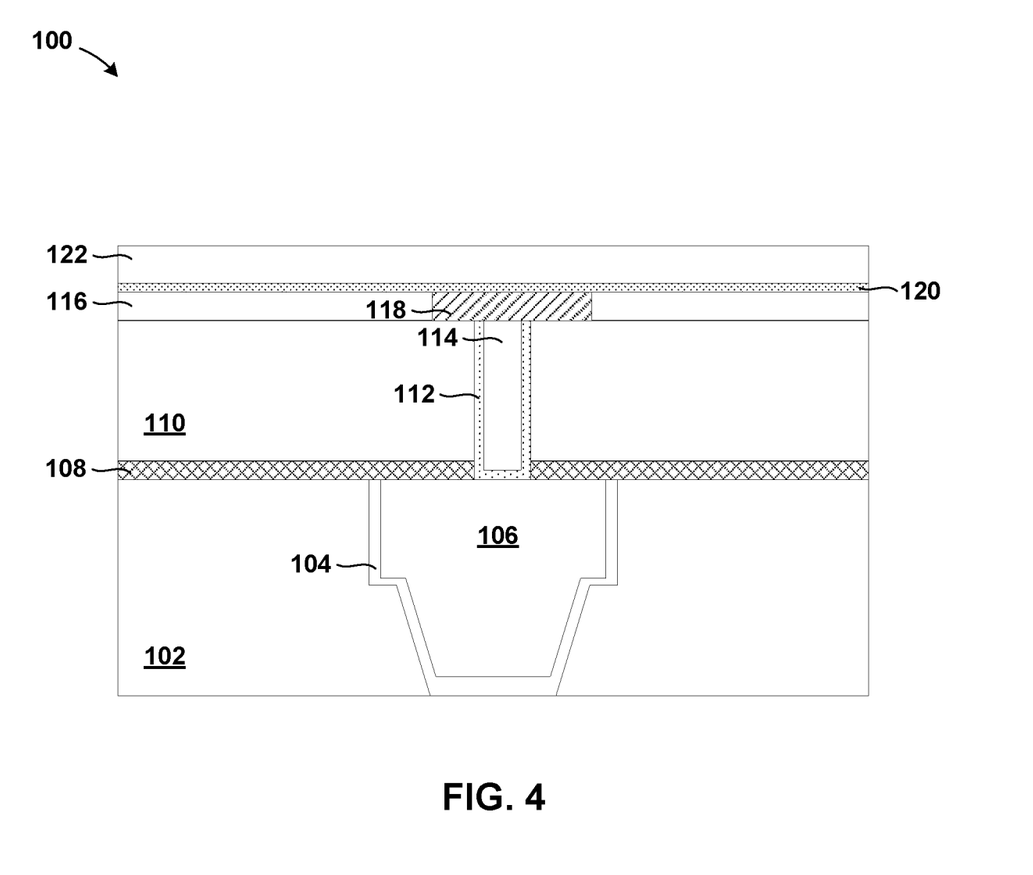
FIG. 4 is a cross section view illustrating a dielectric film and a hard mask formed on top of the first electrode according to an exemplary embodiment.

Referring now to FIG. 4, the structure 100 with a dielectric film 120 and a hard mask 122 is shown, in accordance with an embodiment. The dielectric film 120 is deposited on top of the structure 100 using known deposition techniques such as, for example, ALD. The dielectric film 120 covers a top surface of the second dielectric cap layer 116 and a top surface of the bottom electrode 118. The dielectric film 120 may be made of a metal oxide such as, for example, hafnium oxide ($HfO_2$), tantalum oxide ($Ta_2O_5$), Zirconium Oxide ($ZrO_2$), Titanium Oxide ($TiO_2$), Aluminum Oxide ($Al_2O_3$), or any other metal oxide material that is compatible with RRAM devices. The choice of metal oxide material is made here to improve durability and consistency of resultant neuromorphic devices. Such choice favors oxides with stronger and more-consistent bonding arrangements such as Hafnium-, Zirconium-, and Aluminum-based oxides and results in a low initial leakage due to their wide bandgap and a high electric field at which filaments are generated. This is contrary to a more conventional wisdom of selecting "memristor" oxides with weaker, less-consistent bonding, e.g. titanium-based oxides, to ease forming filaments at low electric fields. As the result of this choice, the films are made thin, typically, less than 5 nm to reduce initial resistance and to increase electric field at a given applied voltage. Another consequence of this choice is that these dielectric materials are hard to deposit in poly-crystalline form or otherwise crystallize at an BEOL-compatible thermal budget. Furthermore, the crystallization temperature will be even higher for thinner films. The dielectric film 120 may also be referred to as the metal oxide layer and may be fully amorphous and may have a small crystalline structure.

The hard mask 122 is deposited on top of the dielectric film 120 using known deposition techniques such as, for example, ALD. The hard mask 122 covers a top surface of the dielectric film 120. The hard mask 122 may be made of titanium nitride (TiN) or any other material that is suitable to be used as a hard mask.

Figure 5:
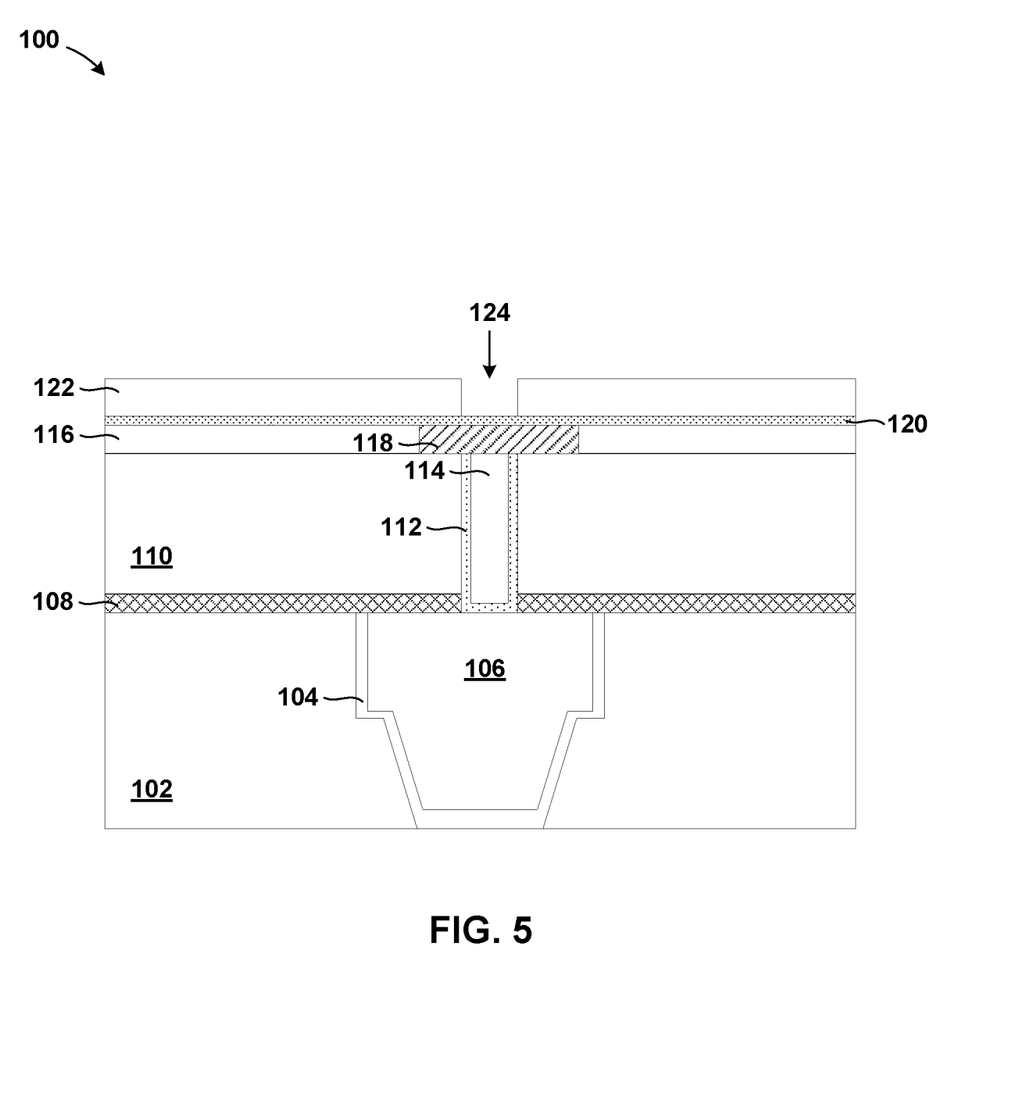
FIG. 5 is a cross section view illustrating an opening formed within the hard mask according to an exemplary embodiment.

Referring now to FIG. 5, the structure 100 with an opening 124 is shown, in accordance with an embodiment. The hard mask 122 is patterned to form the opening 124. The opening 124 extends form a top surface of the hard mask 122 to the top surface of the dielectric film 120. The opening 124 is formed directly above the stud 114 and laterally extends the width of the stud 114. As a result, the top surface of the dielectric film 120 directly above the stud 114 is exposed. After the opening 124 is formed, the exposed dielectric film 120 is doped with a dopant such as, for example, silicon, germanium, aluminum, hafnium, titanium, tantalum, zirconium, or any other material that may reduce crystallization temperature threshold and enhance grain formation within the dielectric film 120. The dielectric film 120 is locally doped. That is, only the exposed portion of the dielectric film 120 within the opening 124 is doped with the dopant. After doping, the hard mask 122 may be optionally stripped (not shown).

In some embodiments, the step of doping may include ion implantation of doping atoms. Ion implantation is a doping technique where the dopant species are first ionized and then accelerated toward the substrate such that they impinge onto the substrate with certain energy. Upon colliding with the substrate, the ions are neutralized and the resultant dopant atoms decelerate within the substrate in collisions with substrate material. The distribution of implanted dopants and their penetration depth depend on selected ion energy for a given substrate material. For a thin dielectric film 120, the implantation energy is selected to be low from about 50 eV to about 3 keV depending on particular ions used. Ions with high atomic number would require a higher energy per a given target penetration depth. Due to a low ion energy, both a beamline ion implantation equipment and a plasma doping equipment can be used for this implantation step. Beamline implantation equipment can provide ion beams with implantation energy down to 100's eV but allows for particular ion selection and filtering. Ion selection and filtering is particular important for metallic elements such as aluminum, hafnium, titanium, tantalum, and zirconium because their precursors may provide undesirable contamination. Plasma doping enables implantation energies down to 50 eV and is suitable for implanting silicon or germanium dopants, for instance. In an embodiment, the thickness of hard mask 122 is selected to stop most of implanted ions in it. Concentration of implanted dopants is controlled by the implanted ion dose. Modulation of film 120 crystallization temperature and grain growth requires up to several atomic percent of dopant in the film. In one embodiment, for a 5 nm-thick film 120, the implanted ion dose is from about 1e14 ions/cm² to about 1e16 ions/cm² providing doping level from about 0.3 atomic percent to about 30 atomic percent. In addition to chemical doping, ion implantation may alter the original, as-deposited bonding structure of the film 120. Specifically, ion implantation may further amorphize any polycrystalline inclusions that may have existed in film 120. This, in turn, may help programming crystallization of implanted film 120 into non-ferroelectric crystalline phases as desired for RRAM devices. In order to promote amorphization of implanted film 120, the implantation step can be conducted into the substrate held at below room temperature. In one embodiment, such cryogenic implantation can be conducted at minus 100° C. Amorphizing implantation may be enabled with chemically neutral ions with respect to film 120 structure such as film constituents (e.g. Oxygen) or noble gases (Neon, Argon, Xeon) and may be conducted separately and in addition to the chemical doping of film 120.

Figure 6:
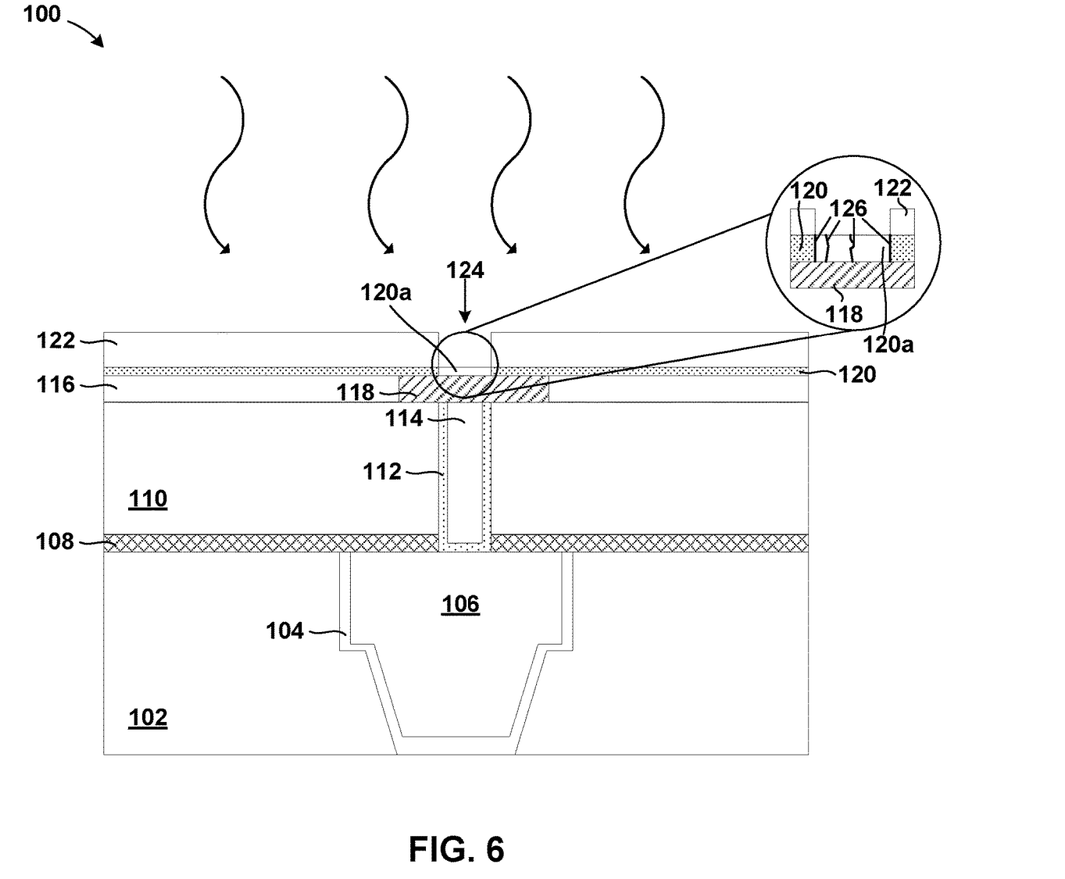
FIG. 6 is a cross section view illustrating grain boundaries formed within a crystalized portion of the dielectric film according to an exemplary embodiment.

Referring now to FIG. 6, an anneal is performed (shown by curved arrows pointing down), in accordance with an embodiment. The anneal temperature and duration are selected to allow for fully crystallizing the doped dielectric film 120, within the opening 124, throughout its thickness without affecting transistors and lower interconnect levels such as the metal interconnect 106. Local doping of the dielectric film 120 reduces crystallization temperature and allows for a wider range of anneal duration while preserving transistors and lower interconnect levels. Undoped portion of the dielectric film 120 may remain intact due to its higher crystallization temperature. Despite the wider range of acceptable anneal duration, shorter anneal durations may still be required to reduce any detrimental effects onto transistors and lower interconnect levels. Ultra-short anneals may crystallize the doped portion of the dielectric film 120 into a ferroelectric crystallographic phase. Ferroelectric phases are common for $HfO_2$— and $ZrO_2$-based dielectrics. Presence of ferroelectric phases may be undesirable for RRAM devices because it may result in nonlinear circuit response during fast operations such as information read operation. Ferroelectric phases have a higher Gibbs free energy than that of non-ferroelectric phases and may form through a kinetic process, especially, at a high anneal temperature. Reducing crystallization temperature via doping, selecting somewhat longer anneal duration, and eliminating ferroelectric phase nuclei through implant-based amorphization allow for steering crystallization process of doped dielectric film 120 into non-ferroelectric phases. Typical non-ferroelectric phases produced in such crystallization process are tetragonal, cubic, and monoclinic crystalline phases.

In accordance with an embodiment, a nanosecond-scale anneal allows for fully crystallizing the dielectric film 120, within the opening 124, throughout its thickness without affecting transistors and lower interconnect levels such as the metal interconnect 106. The term "laser annealing" denotes an annealing method that employs a laser to induce heat in the surface being treated. A laser is an electro-optical device that emits coherent radiation. In some embodiments, a typical laser emits light in a narrow, low-divergence beam and with a defined wavelength. In some instances, the advantages of employing laser for annealing processes is that the laser's light may be easily shaped and focused onto a specific area of the annealing surface to achieve very high radiation intensity with short exposure durations.

The short exposure duration is achieved by raster scanning focused laser beam over the substrate surface. In this case, the exposure duration measured at incident intensity at Full Width Half Maximum (FWHM) is the beam width in the scanning direction divided by the scanning velocity. In alternative embodiments, the short exposure duration is achieved by employing a pulsed laser. In this case, the laser beam is shaped to achieve a required peak intensity over a selected dielectric film 120 and/or hard mask 122 area such as over an entire product die and the laser is operated in a pulsed mode such as in the case of Q-switched laser. The pulse duration of Q-switched laser at intensity FWHM determines the substrate exposure time. The exposure process may be repeated for an entire wafer surface in a step-and-repeat approach. In some embodiments, the exposure to light, i.e., by laser annealing, e.g., application of the laser beam, includes 1 pulse to 1000 pulses of light exposure.

The laser type that is employed in the laser annealing method is selected from a solid-state Nd:YAG laser emitting at 1064 nm and frequency-doubled or -tripled emitting at 532 nm or 355 nm, respectively, or an excimer laser emitting at below 400 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include F2 (fluorine, emitting at 157 nm), and noble gas compounds such as ArF (193 nm), KrCl (222 nm), KrF (248 nm), XeCl (308 nm), and XeF (351 nm). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. In some embodiments, the XeCl laser (308 nm) was employed coupling about 40-60% of its incident radiation into metallic layers within about 10-20 nm of the surface.

Once the substrate is exposed to the laser radiation either through raster scanning or through a laser pulse, its surface temperature begins raising from its base value and falls shortly after. A representative temperature-time trace of a nanosecond laser anneal process includes 4 distinct temperature regions: initial or base substrate temperature, preheat portion (optional), heat-up portion, temperature peak point, and cool down portion. Initial or base substrate temperature is within the range of from 23° C. (room temperature) to 400° C. This temperature is typically set by a hot plate on which the substrate resides. The preheat portion can raise the substrate surface temperature by several 100's° C. from the base temperature for a relatively short duration to ease the energy requirement in the next heating phase while, at the same time, preserving temperature sensitive elements that may exist in the substrate. This optional heating is typically accomplished with an auxiliary heating device such as a secondary heating laser operating in millisecond exposure regime. The laser operating in nanosecond-scale duration enables the main heat up portion. The laser beam raises the surface temperature of substrate from the preheat base or base temperature to the peak with the ramp up rate from about 1,000,000,000° C./sec to about 100,000,000,000° C./sec. After laser radiation exposure, the surface temperature quickly drops back to the base temperature with the temperature ramp down rate of from about 300,000,000° C./sec to about 30,000,000,000° C./sec. The anneal duration measured at around the temperature peak point, typically at a level 50° C. below the peak point, ranges from about 1 nanosecond to about 500 nanoseconds but from around 10 to 100 nanoseconds is more typical. It is customary to specify the process duration of laser anneals in terms of the radiation exposure duration at FWHM rather than the anneal duration at the temperature level 50° C. below the peak temperature. These duration quantities are related to each other and, in some embodiments, the anneal duration is a fraction (e.g. about ⅓) of the radiation exposure duration.

Laser-induced surface temperature rise is set by the laser incident radiation intensity, laser pulse or exposure duration, and substrate thermal and optical properties. The laser radiation is coupled into metallic films where it is absorbed and is converted into heat within 10-20 nm from the surface and then the heat quickly spreads heating up surrounding structures. Hence, short frontside laser exposure causes a non-uniform heating within top structures. The heat penetration depth in the case of nanosecond-scale laser pulses ranges from about 1 micron to about 4 microns in metals and semiconductors and from about 100 nanometers to about 500 nanometers in typical dielectrics. Shorter laser pulses cause a high nonuniformity and a higher degree of heating localization. Accordingly, a relatively thin metallic layer such as the bottom electrode 118 and the hard mask 122, if present, are heated relatively uniformly throughout its entire thickness with a small top-to-bottom temperature gradient of ~0.1-0.3° C./nm while the dielectric thermal isolation (the second dielectric layer 110) and the stud 114 induce a large top-to-bottom temperature gradient of ~1-3° C./nm. The dielectric film 120 residing atop of the bottom electrode 118 may be heated from below to nearly the same temperature as that of the bottom electrode 118. The peak temperature of such adjacent, dielectric film 120 will be slightly lower (e.g. 50° C. lower) than that of the bottom electrode 118 due to the interfacial thermal resistance that exists between these dissimilar films.

It should be appreciated that the required radiation intensity at which the dielectric film 120 located atop of bottom electrode 118 reaches desired high peak point (e.g. 1300° C.) depends on underlying thermal isolation structure, laser pulse duration and energy density, and selected laser wavelength. In some embodiments, the nanosecond laser wavelength is 308 nm, the thermal isolation structure underneath the bottom electrode 118 is the second dielectric layer 110 made of silicon oxide with a thickness of about 400 nm, the substrate/preheat base temperature is 250° C., the pulse duration at FWHM is 160 nanoseconds, and the coupled laser energy density at which the dielectric film 120 reaches 1300° C. is 0.3 J/cm$^2$ (this corresponds to 0.4 J/cm$^2$ of incident laser energy density). Presence of the stud 114 connection to the bottom electrode 118 may alter these energy densities because the stud 114 is made of tungsten which is a highly thermally conducted material, however, due to a small stud dimension, its effect onto thermal isolation is reduced. While the type, thickness, and width of the thermal isolation structure (second dielectric layer 110) and the laser parameters may vary affecting the choice of the incident laser energy density, the range of incident laser energy density from about 0.03 J/cm² to about 3 J/cm² and laser radiation exposure duration from about 5 to 500 nanoseconds can be employed to bring the dielectric film 120 to the desired peak temperature to induce it crystallization and grain growth. To further enhance the crystallization process without compromising thermal integrity of the substrate and the metal interconnect 106, multiple laser pulses may be employed. Each individual pulse results in incremental grain growth. Up to 1000 individual laser pulses may be applied to the dielectric film 120 atop of the bottom electrode 118 to fully crystallize a portion of the dielectric film 120 in the vicinity of the bottom electrode 118. Duration of individual pulses can be chosen to steer the crystallization process into non-ferroelectric phases such as tetragonal, cubic, and monoclinic crystalline phases.

With continued reference to FIG. 6, a crystalized portion of the dielectric film 120a is located on top of the bottom electrode 118, within the opening 124. The crystalized portion of the dielectric film 120a may be less than 5 nm thick. The remaining portions of the dielectric film 120, below the hard mask 122, may remain fully amorphous or with an original small-grain structure. Further, doping the portion of the dielectric film 120 within the opening 124 and performing the laser anneal enhances the growth or formation of grain boundaries 126 within the dielectric film 120 that is doped with the dopant and exposed to the laser anneal. Longer duration of individual laser pulses steers the crystallization process into non-ferroelectric phases such as tetragonal, cubic, and monoclinic crystalline phases.

The enlarged view of the crystalized portion of the dielectric film 120a, shown in FIG. 6, illustrates the grain boundaries 126. During the laser anneal, the bottom electrode 118 and the hard mask 122 get heated thus heating the dielectric film 120 in its vicinity. Heating of the dielectric film 120 forms the crystalized portion of the dielectric film 120a. The crystalized portion of the dielectric film 120a may include grains (not shown) and the grain boundaries 126. The grain boundaries 126 are formed at a junction where two grains meet. In an embodiment, the laser annealing parameters are selected to cause a full crystallization making average grain size larger than the dielectric film 120/120a thickness ensuring that most of grain boundaries 126 run through the entire thickness of the dielectric film 120a. The grain boundaries 126 may transform into filaments when voltage to the bottom electrode 118 is applied. It is easier to form filaments at the grain boundaries 126 because the bonding of adjacent atoms in the grain boundary is not as uniform as the bonding of adjacent atoms within the grain.

Doping allows for a smaller number of larger grain boundaries 126 to form within the doped dielectric film 120 when compared to the dielectric film 120 that is undoped. That is, the dielectric film 120 that is undoped forms a larger number of smaller grain boundaries 126 when exposed to laser anneal whereas the dielectric film 120 that is doped forms a smaller number of larger grain boundaries 126. In addition, it is advantageous to have a smaller number of larger grain boundaries 126 because these larger grain boundaries 126 facilitate the formation of filaments during device operation. These filaments in turn reduce variation of the RRAM during its performance. In addition, doping allows for a low crystallization temperature and ability to steer crystallization process into non-ferroelectric phases by means of selecting longer laser pulses. Non-ferroelectric phases result in a linear RRAM device response at a high read/write speed.

As stated above, the laser anneal crystalizes the portion of the doped dielectric film 120 within the opening 124, above the stud 114, to form the crystalized portion of the dielectric film 120a. This is due to the fact that the remaining portions of the dielectric film 120 have a higher crystallization temperature. Further, the stud 114 connects the metal interconnect 106 with the bottom electrode 118. The stud 114 and the thickness of the second dielectric layer 110 allows for the metal interconnect 106 to be separated from the bottom electrode 118 and the dielectric film 120. Generally, the second dielectric layer 110 may have a thickness of about 100 nm to keep the aspect ratio of the stud 114 as small as possible. This in turn may keep the electrical resistance of the stud 114 low. However, the separation between the metal interconnect 106 and the bottom electrode 118 of 100 nm may not be adequate for protecting the metal interconnect 106 from a thermally induced degradation. Longer laser pulses that are advantageous for steering crystallization process into non-ferroelectric phases may require a thicker thermal isolation. The overall RRAM resistance is not limited by the resistance of the stud 114 and the resistance of the stud 114 may be increased without a big detrimental effect onto the RRAM device performance by increasing the separation between the metal interconnect 106 and the bottom electrode 118 to accommodate longer laser pulses. As a result of this separation, when the longer laser anneal is performed, the integrity of the metal interconnect 106 is maintained because the metal interconnect 106 does not get heated to high temperatures. For instance, the thermal isolation structure (i.e. the second dielectric layer 110 and the stud 114) with a 1° C./nm thermal gradient and a 300 nm separation will allow reaching 1300° C. for the dielectric film 120 while keeping the interconnect 106 temperature below the melting point of copper at 1087° C.

Figure 7:
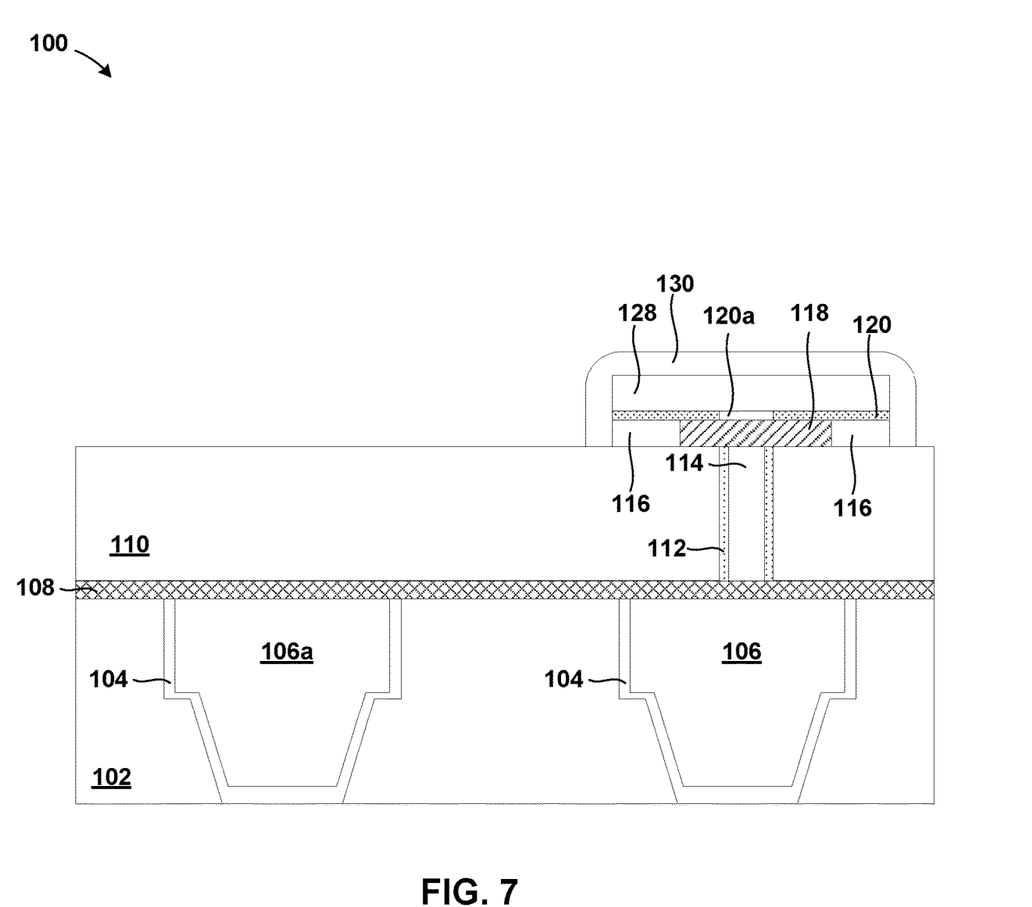
FIG. 7 is a cross section view illustrating a top electrode formed above the bottom electrode according to an exemplary embodiment.

Referring now to FIG. 7, the structure 100 with a top electrode 128 and an encapsulation layer 130 is shown, in accordance with an embodiment. In an embodiment, after the laser anneal is performed, the opening 124, illustrated in FIG. 6, may be filled with a material such as titanium nitride or tantalum nitride. In an alternative embodiment, the hard mask 122 may first be removed using an etch process and a metal layer (not shown) may be deposited, using known depositing techniques, on top of the structure 100. The hard mask 122 may also be removed prior to conducting anneal, as alluded above. The metal layer may cover a top surface of the dielectric film 120 that is amorphous and a top surface of the crystalized portion of the dielectric film 120a. The metal layer may be made of metal such as, for example, titanium nitride or a combination of titanium nitride and tantalum nitride.

After the opening 124 is filled, the structure 100 undergoes further processing to form the top electrode 128. The hard mask 122 may be patterned by performing lithography and an etch process such as, for example, a reactive ion etch process. The patterning results in the formation of the top electrode 128. Lithography and etching are used to form a RRAM pillar. The RRAM pillar includes the bottom electrode 118, portions of the dielectric film 120, the crystalized portion of the dielectric film 120a, and the top electrode 128.

The top electrode 128 may also be referred to as a second electrode. The top electrode 128 is formed above the bottom electrode 118 however, the top electrode 128 has a larger width than the bottom electrode 118. As a result, the top electrode 128 laterally extends beyond the vertical sidewalls of the crystalized portion of the dielectric film 120a.

It should be appreciated that FIG. 7 also illustrates a plurality of metal interconnects 106, 106a. Embodiments of the present invention contemplate fabricating a plurality of metal interconnects 106 during the fabrication of the stud 114 and the BEOL embedded RRAM device.

The encapsulation layer 130 is deposited on the top surface of the structure 100, covering the top electrode 128. The encapsulation layer 132 also covers the sidewalls of the second dielectric cap layer 116 and the sidewalls of the dielectric film 120. The encapsulation layer 132 may be made of silicon nitride or any other material that may provide a moisture barrier for the dielectric film 120. The structure 100 then undergoes a masking and an etch process to remove the encapsulation layer 132 from portions of the structure 100, exposing the top surface of the second dielectric layer 110. A portion of the encapsulation layer 132 remains around the top electrode 128 and the sidewalls of the dielectric film 120 and the sidewalls of the second dielectric cap layer 116.

Figure 8:
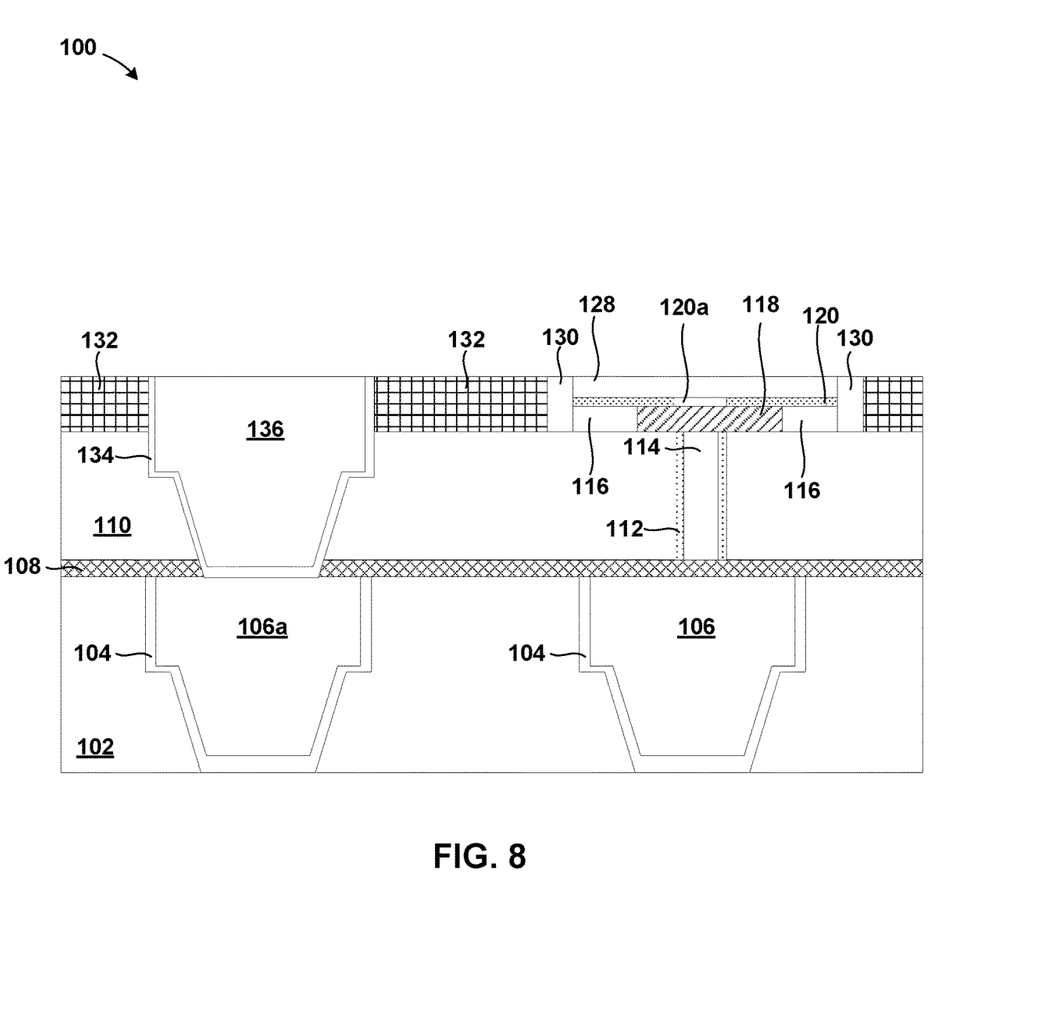
FIG. 8 is a cross section view illustrating a second metal interconnect formed according to an exemplary embodiment.

Referring now to FIG. 8, the structure 100 with a third dielectric layer 132 and a second metal interconnect 136 is shown, in accordance with an embodiment. The third dielectric layer 132 is deposited on top of the structure 100 covering the top surface of the top electrode 128 utilizing a conventional deposition process such as, for example, CVD, PECVD, PVD, or ALD. The third dielectric layer 132 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The third dielectric layer 132 may also be referred to as an interlayer dielectric. The third dielectric layer 132 is then planarized by chemical mechanical polishing (CMP) process.

The structure 100 undergoes another fabrication process where a via and a trench (not shown) are patterned within the third and second dielectric layers 132, 110 on top of the metal interconnect 106a. A third liner 134 is conformally deposited on top of the structure 100 using a conventional deposition process such as, for example, ALD. The third liner 134 may be made of substantially the same material as the first and second liners 104, 112. A metallization process known in the art is then performed to fill the via and the trench with a metal such as, for example copper, to form the second metal interconnect 136. The second metal interconnect 136 is above and in electrical connectivity with the metal interconnect 106a. A planarization process, such as, for example, CMP, may be done to remove excess material from a top surface of the structure 100, exposing the top surface of the top electrode 128 and the second metal interconnect 136.

Figure 9:
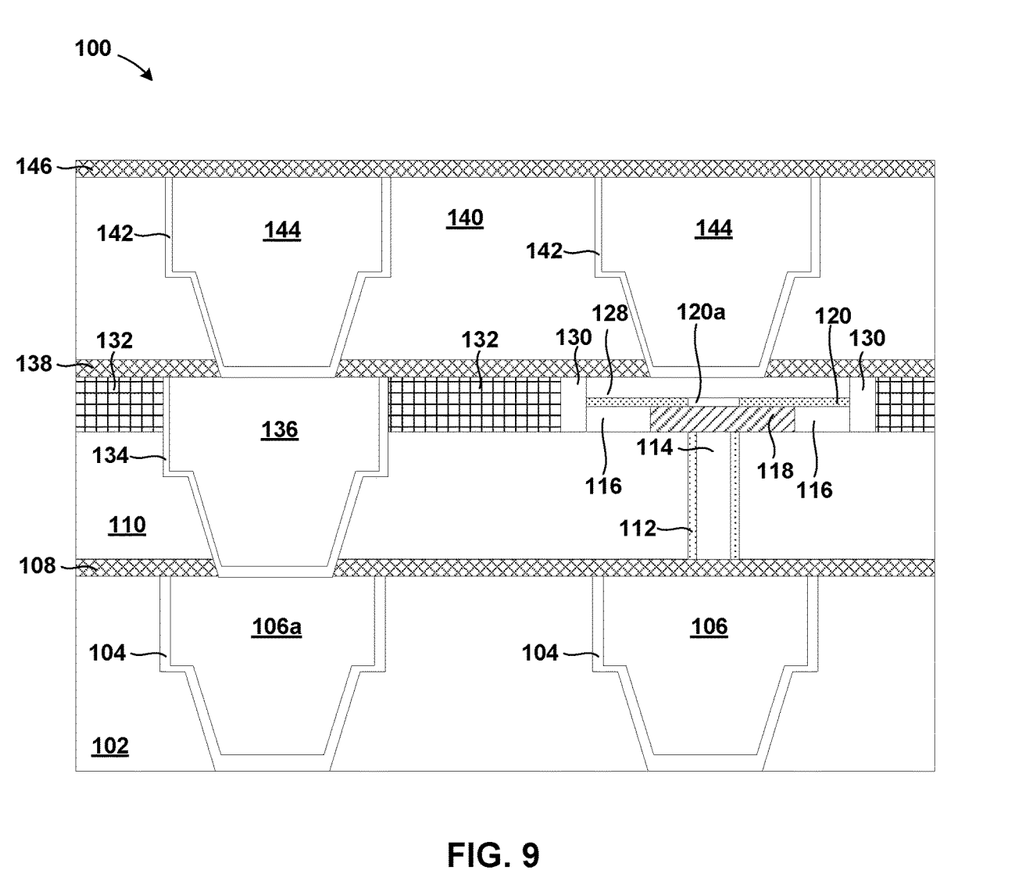
FIG. 9 is a cross section view illustrating a next wire level formed on top of the buried RRAM according to an exemplary embodiment.

Referring now to FIG. 9, the structure 100 with another level of metal interconnects 144 fabricated above the RRAM device is shown, in accordance with an embodiment. A third dielectric cap layer 138 is first deposited on top of the structure 100 covering a top surface of the second metal interconnect 136 and the top surface of the top electrode 128. The third dielectric cap layer 138 is deposited using a conventional deposition process such as, for example, PECVD or ALD. The third dielectric cap layer 138 may be made of substantially the same material as the first and second dielectric cap layers 108, 116. A fourth dielectric layer 140 is then deposited on top of the third dielectric cap layer 138, using conventional deposition processes. The fourth dielectric layer 140 may be made of substantially the same material as the third dielectric layer 132.

The structure 100 undergoes additional fabrication process during which vias and trenches (not shown) are patterned within the fourth dielectric layer 140 and the third dielectric cap layer 138. A fourth liner 142 is then conformally deposited on top of the structure 100 using known deposition techniques such as, PVD, CVD, or ALD. The fourth liner 142 may be made of substantially the same material as the first, second, and third liners 104, 112, 134. A metallization process known in the art is then performed to fill the vias and the trenches with a metal such as, for example copper, to form the third metal interconnects 144. In an embodiment, one of the third metal interconnects 144 is above and in electrical connectivity with the second metal interconnect 136 and the other of the third metal interconnects 1414 is above and in electrical connectivity with the second electrode 128. The third metal interconnect 144 may also be referred to as an upper metal interconnect. A planarization process, such as, for example, CMP, may be done to remove excess material from a top surface of the structure 100, exposing the top surfaces of the third metal interconnects 144. A fourth dielectric cap layer 146 is deposited on top of the structure 100, covering the top surfaces of the third metal interconnects 144. The fourth dielectric cap layer 146 may be made of substantially the same material as the first, second, and third dielectric cap layers 108, 116, 138. The fourth dielectric cap layer 146 is deposited using a conventional deposition process such as, for example, PECVD or ALD.

The resultant structure 100, illustrated in FIG. 9, includes a BEOL embedded RRAM device between two wire levels. That is, the RRAM device is embedded between the third metal interconnect 144 (i.e. upper metal interconnect) and the metal interconnect 106 (i.e. lower metal interconnect) in a backend structure of a semiconductor chip. The RRAM device includes the bottom electrode 118, the dielectric film 120, and the top electrode 128. The bottom electrode 118 is directly above the stud 114 and in electrical contact with the metal interconnect 106. The dielectric film 120 is directly above the bottom electrode 118. The dielectric film 120 laterally extends beyond the sidewalls of the bottom electrode 118. The top electrode 128 is directly above the dielectric film 120 and laterally extends such that the sidewalls of the top electrode 128 and the sidewalls of the dielectric film 120 are substantially flush. The top electrode 128 is below and in electrical contact with the third metal interconnect 144.

In an embodiment of the present invention, the laser anneal process is used to crystalize portions of the dielectric film 120, locally doped with a dopant directly above and in the vicinity of the stud 114, to form the crystalized portion of the dielectric film 120a. The crystallization of the dielectric film 120 produces grains and grain boundaries 126. The dopant in the dielectric film 120a facilitates the production of large grains at a lower anneal temperature. Further, utilizing a plurality of laser anneal pulses allows for the dielectric film 120 to crystalize and form grain boundaries 126 without adversely impacting the metal interconnect 106 below the stud 114. In addition to the use of short duration laser anneal, most of the dielectric film 120 is separated from the metal interconnect 106 by the second dielectric layer 110. This separation provides a thermal isolation. Longer laser pulses require a thicker thermal isolation. Longer laser pulses are advantageous for steering crystallization of doped dielectric film into non-ferroelectric crystallographic phases.

In an embodiment, the second dielectric layer 110 may be about 400 nm thick to accommodate longer laser pulses. As a result, a distance between the third metal interconnect 144 (i.e. upper metal interconnect) and the metal interconnect 106 (i.e. lower metal interconnect) is at least 400 nm. In an alternative embodiment, the thickness of the second dielectric layer 110 may be in the range of about 200 nm to about 300 nm.

Locally doping the dielectric film 120 that is right on top of the stud and then performing an anneal process produces a smaller amount of large grain boundaries 126 that facilitate in the formation of filaments at the location of the grain boundaries 126 when the RRAM is in use. For example, during the subsequent utilization of the RRAM device, a low voltage may be applied to the bottom or the top electrodes 118, 128 causing filaments to form within the crystalized portion of the dielectric film 120a. Having the grain boundaries 126 allows for the RRAM device to operate at a lower voltage in order to form the filaments. As a result, forming the filaments at lower voltages is preferred because at lower voltages the speed at which the filaments are formed may be controlled and the filaments are formed consistently and in increments. This allows for the RRAM device to be scaled without introducing RRAM device variability. In addition, selecting anneal duration and temperature allows for steering crystallization process of doped dielectric film 120 into non-ferroelectric phases such as tetragonal, cubic, and monoclinic crystalline phases. Non-ferroelectric phases result in a linear RRAM device response at a high read/write speed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a resistive random access memory device embedded between an upper metal interconnect and a lower metal interconnect in a backend structure of a chip, the resistive random access memory includes a bottom electrode and a top electrode separated by a dielectric film, wherein a portion of the dielectric film directly above the bottom electrode is doped and crystalline;
   a stud below and in electrical contact with the bottom electrode and the lower metal interconnect; and
   a dielectric layer between the upper metal interconnect and the lower metal interconnect, the dielectric layer separates the upper metal interconnect from the lower metal interconnect.

2. The semiconductor structure of claim 1, wherein the crystalline portion of the dielectric film includes grain boundaries that extend through an entire thickness of the dielectric film.

3. The semiconductor structure of claim 1, wherein the crystalline portion of the dielectric film includes grains, wherein an average grain size is larger than a thickness of the dielectric film.

4. The semiconductor structure of claim 3, wherein the grains have non-ferroelectric properties.

5. The semiconductor structure of claim 1, wherein the dielectric film is made of hafnium oxide.

6. The semiconductor structure of claim 1, wherein the dopant is silicon or zirconium.

7. The semiconductor structure of claim 1, wherein the stud bridges a distance from the bottom electrode of the resistive random access memory to the lower metal interconnect.

8. A semiconductor structure comprising:
   a resistive random access memory device embedded between an upper metal interconnect and a lower metal interconnect in a backend structure of a chip, the resistive random access memory includes a bottom electrode and a top electrode separated by a dielectric film, wherein the top electrode is below and in electrical contact with the upper metal interconnect, wherein a portion of the dielectric film directly above the bottom electrode is doped and crystalline;
   a stud below and in electrical contact with the bottom electrode and the lower metal interconnect, wherein the stud is made of a refractory metal; and
   a dielectric layer between the upper metal interconnect and the lower metal interconnect, the dielectric layer separates the upper metal interconnect from the lower metal interconnect.

9. The semiconductor structure of claim 8, wherein the crystalline portion of the dielectric film includes grain boundaries that extend through an entire thickness of the dielectric film.

10. The semiconductor structure of claim 8, wherein the crystalline portion of the dielectric film includes grains, wherein an average grain size is larger than a thickness of the dielectric film.

11. The semiconductor structure of claim 10, wherein the grains have non-ferroelectric properties.

12. The semiconductor structure of claim 8, wherein the dopant is silicon or zirconium.

13. The semiconductor structure of claim 8, wherein the dielectric film is made of hafnium oxide.

14. A method comprising:
   forming a stud below and in electrical contact with a bottom electrode and a lower metal interconnect;
   depositing a dielectric layer between an upper metal interconnect and the lower metal interconnect, the dielectric layer separates the upper metal interconnect from the lower metal interconnect;
   forming a resistive random access memory device embedded between the upper metal interconnect and the lower metal interconnect in a backend structure of a chip, the resistive random access memory includes a bottom electrode and a top electrode separated by a dielectric film;
   locally doping with a dopant a portion of the dielectric film above the bottom electrode; and
   annealing the dielectric film to crystalize the doped portion of the dielectric film above the bottom electrode.

15. The method of claim 14, wherein the crystalline portion of the dielectric film includes grain boundaries that extend through an entire thickness of the dielectric film.

16. The method of claim 14, wherein the crystalline portion of the dielectric film includes grains, wherein an average grain size is larger than a thickness of the dielectric film.

17. The method of claim 16, wherein the grains have non-ferroelectric properties.

18. The method of claim 14, wherein the dopant is silicon or zirconium.

19. The method of claim 14, wherein annealing comprises laser annealing.

20. The method of claim 14, wherein locally doping comprises ion implantation of doping atoms.

* * * * *